(12) United States Patent
Luning (10) Patent No.: US 6,440,819 B1
(45) Date of Patent: *Aug. 27, 2002

(54) METHOD FOR DIFFERENTIAL TRENCHING IN CONJUNCTION WITH DIFFERENTIAL FIELDOX GROWTH

(75) Inventor: Scott Luning, San Francisco, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,100

(22) Filed: Mar. 3, 1998

(51) Int. Cl.[7] .............................................. H01L 21/76
(52) U.S. Cl. ....................... 438/444; 438/422; 438/425; 438/427; 438/439
(58) Field of Search ........................ 438/424, 425–427, 438/439, 444, 700, FOR 221, FOR 229

(56) References Cited

U.S. PATENT DOCUMENTS

| | | | | |
|---|---|---|---|---|
| 4,574,465 A | | 3/1986 | Rao .............................. 29/571 |
| 4,892,614 A | * | 1/1990 | Chapman et al. ............ 438/425 |
| 4,897,364 A | | 1/1990 | Nguyen et al. ............... 437/69 |
| 4,971,923 A | | 11/1990 | Nakanishi .................... 437/52 |
| 4,987,093 A | | 1/1991 | Teng et al. ................... 437/69 |
| 5,151,381 A | | 9/1992 | Liu et al. ..................... 437/69 |
| 5,316,966 A | * | 5/1994 | Van der Plas et al. ....... 438/401 |
| 5,372,951 A | | 12/1994 | Anjum et al. ................ 437/24 |
| 5,382,541 A | * | 1/1995 | Bajor et al. .................. 438/427 |
| 5,428,239 A | | 6/1995 | Okumura et al. ............ 257/371 |
| 5,438,016 A | * | 8/1995 | Figura et al. ................ 438/444 |
| 5,455,438 A | | 10/1995 | Hashimoto et al. ......... 257/391 |
| 5,466,623 A | | 11/1995 | Shimizu et al. .............. 437/52 |
| 5,472,904 A | * | 12/1995 | Figura et al. ................ 438/426 |
| 5,506,813 A | | 4/1996 | Mochizuki et al. ..... 365/230.03 |
| 5,536,675 A | * | 7/1996 | Bohr ........................... 438/427 |
| 5,646,052 A | | 7/1997 | Lee ............................. 437/67 |
| 5,683,932 A | * | 11/1997 | Bashir et al. ................ 438/427 |
| 5,731,221 A | * | 3/1998 | Kwon .......................... 438/426 |
| 5,753,962 A | * | 5/1998 | Jeng ............................ 257/510 |

FOREIGN PATENT DOCUMENTS

| EP | 0 467 988 A1 | 9/1991 |
|---|---|---|
| JP | 08 172 087 A | 7/1996 |

OTHER PUBLICATIONS

"Silicon Processing for the VLSI Era", vol. 2: Process Integration by Stanley Wolf, Ph.D., Lattice Press, Sunset Beach, California, (1990).
"Patent Abstracts of Japan", vol. 096, No. 006, Jun. 28, 1996, application No. 08055845, application No. 06189173.
"Patent Abstracts of Japan", vol. 017, No. 415 Aug. 03, 1993, publication No. 05082516, application No. 03272096.
Publication entitled: "DW–LOCOS: a convenient VLSI isolation technique", by Bellutti, Boscardin, Soncini, Zen and Zorzi; Semiconductor Science and Technology 10 (1995) Dec., No. 12, Bristol, GB.

* cited by examiner

Primary Examiner—Carl Whitehead, Jr.
Assistant Examiner—Khanh Duong
(74) Attorney, Agent, or Firm—Fliesler, Dubb, Meyer & Lovejoy LLP (57) ABSTRACT

A local oxidation of silicon (LOCOS) process directed to forming differential field oxide thickness on a single wafer with minimized process steps and optimized planarity. When patterning the masking layer, at least two window widths are formed in the masking layer, exposing the underlying substrate and pad oxide. When one of the window widths is sufficiently small, oxidation of the substrate will be inhibited causing reduced growth and thus a reduced field oxide thickness in that window as compared to other larger windows formed in the same masking layer, creating differential field oxide thicknesses in one growth step. To optimize planarity, prior to oxidation variable depth trenches are formed in alignment with the windows so that the resulting field oxide regions are substantially planar with the substantial surface.

9 Claims, 13 Drawing Sheets

METHOD FOR DIFFERENTIAL TRENCHING IN CONJUNCTION WITH DIFFERENTIAL FIELDOX GROWTH

CROSS-REFERENCE TO RELATED APPLICATIONS

The present application is related to U.S. application Ser. No. 08/702,766, entitled "Method for Differential Field Oxide Growth", filed Aug. 22, 1996, and incorporated herein by reference.

BACKGROUND OF THE INVENTION

1. Field of Invention

The invention relates to local oxidation of silicon (LOCOS) processes and more particularly to differential field oxide growth on a single wafer.

2. Description of Related Art

Figure 1:
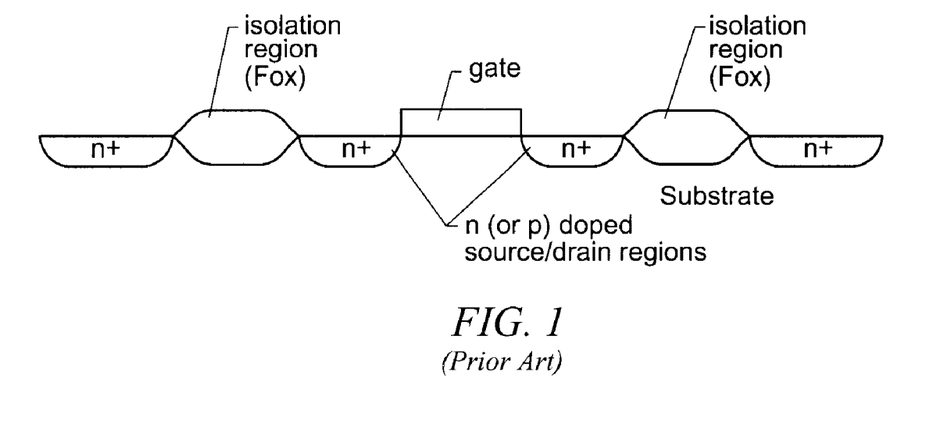
FIG. 1 is a cross-sectional view of a wafer construct having isolation regions.

Generally, in integrated circuit devices, active devices are formed on a semiconductor substrate. In integrated circuits such as memories, programmable logic devices (PLDs), and other integrated circuits, active devices must be electrically isolated from each other. One way to isolate the devices is to grow a field oxide region between devices, as shown in FIG. 1, typically through a local oxidation of silicon (LOCOS) process.

Figure 2A:
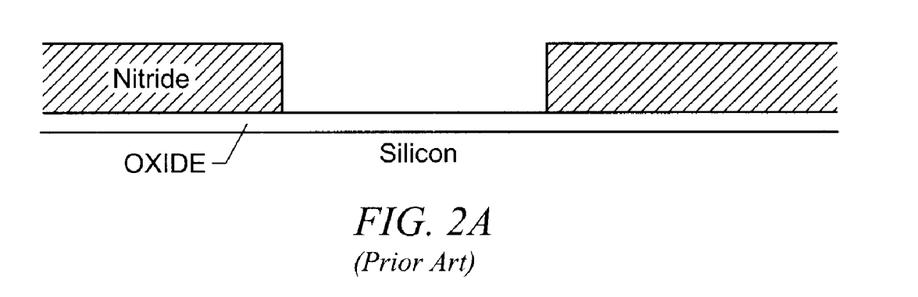
FIG. 2A is a cross-sectional view of wafer construct prior to a conventional LOCOS process.
Figure 2B:
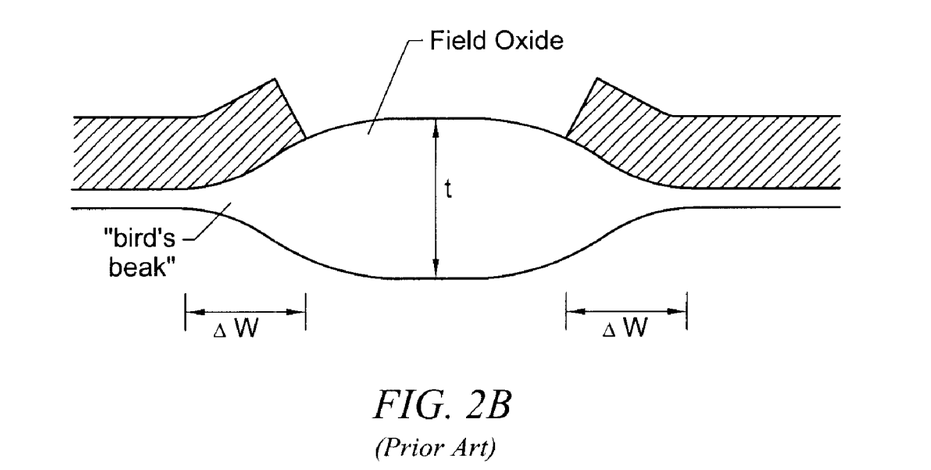
FIG. 2B is a cross-sectional view of the wafer construct immediately subsequent to oxidation in a conventional LOCOS process.

LOCOS processes typically begin with a silicon substrate upon which is grown a thin pad oxide (typically 100 Å–500 Å). A nitride ($Si_xN_y$) layer is deposited over the pad oxide. The nitride layer is patterned and parts are removed to form windows exposing the pad oxide. The resulting structure is shown in the cross-section of FIG. 2A. Occasionally some or all of that portion of the pad oxide underlying the removed nitride portion is also removed exposing the substrate. The wafer is then exposed to an oxidizing ambient, either a wet or dry oxidant, and oxidation of the exposed substrate and pad oxide takes place. The result, shown in FIG. 2B, is a field oxide region that effectively isolates neighboring devices (transistors) from one another. Note that a pad oxide is not necessary for oxidation but is beneficial in relieving stress that occurs.

As shown in the cross-section of FIG. 2B, during the oxidation, the field oxide region not only grows vertically, up into the window formed by the patterned nitride and directly below the window into the substrate, but the oxidant also diffuses laterally, under the nitride. This lateral diffusion is known as encroachment ($\Delta W$) and forms an area in the field oxide known as the "bird's beak." Encroachment is typically undesirable as it causes a larger field oxide area than is desired, thus decreasing packing density of devices per wafer. Because as field oxide thickness increases, encroachment also increases, one way to minimize encroachment is to use the minimum field oxide thickness required.

Figure 3:
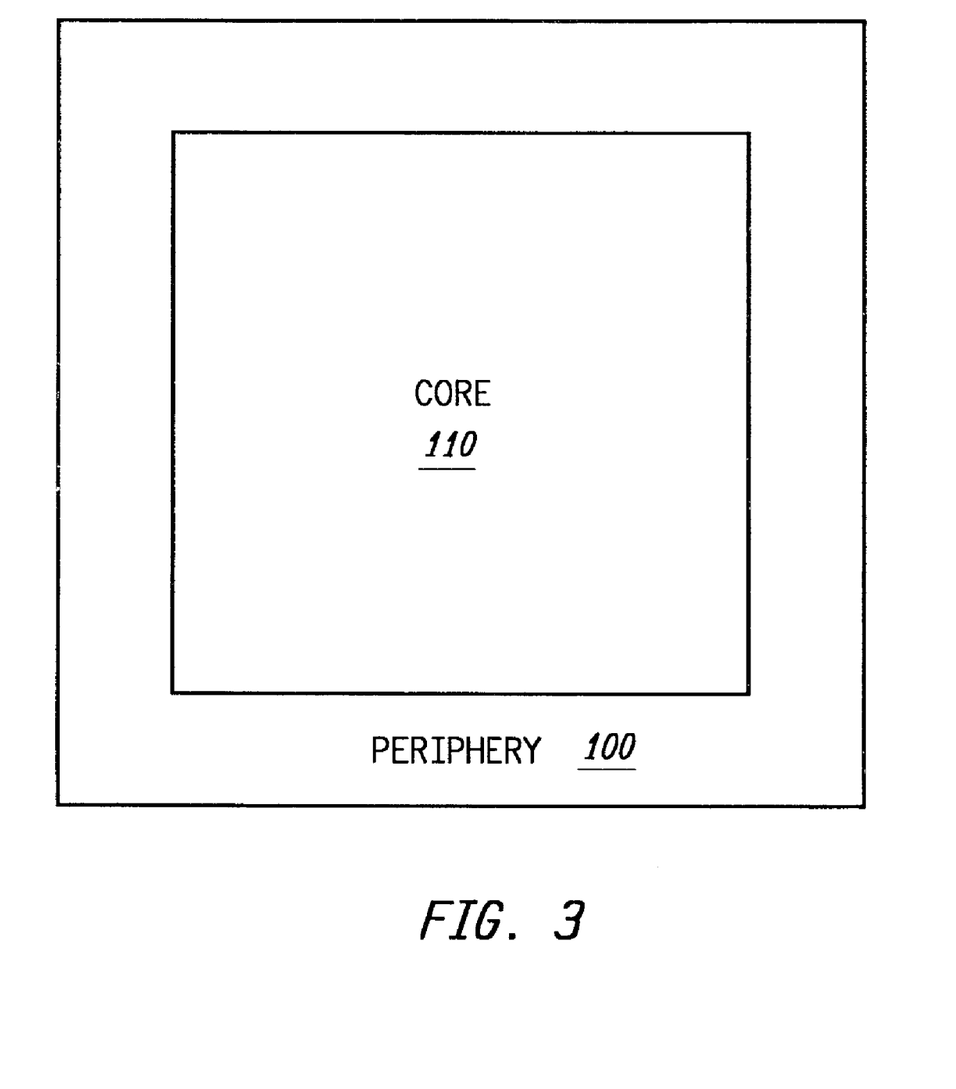
FIG. 3 is a representational block diagram of a memory device.

Memory devices can typically be divided into core and periphery regions, shown in the block diagram of FIG. 3. The core region 110 contains specialized memory cells which are used solely for information storage, while the periphery region 100 contains various logic needed to make stored information accessible, making the two regions functionally distinct. Such center versus edge placement is typical, but not required, of memory cell structure.

Typically, during fabrication of memory cells, manufacturers grow field oxide regions of the same thickness in both the core and the periphery, usually approximately 4000 Å. However, due to device considerations, e.g., voltages, doping, and field thresholds, only an isolation region of approximately 2500 Å is needed between devices in the core compared with that required for the periphery. In addition, use of a smaller isolation region in the core decreases the amount of encroachment experienced in the core and would allow increased packing density for memory cells thereby allowing memory chips to either shrink in size or to increase storage capacity on the same size chip. Thus, it is desirable to grow field oxides of different thicknesses on a single substrate.

SUMMARY OF THE INVENTION

The present invention, roughly described, is directed toward a method for differential field oxide growth. It is desirable on some integrated circuits, and particularly memory devices, that the isolation, or field oxide, regions be of different thicknesses in the core area and the periphery area of the device. However, it is further desirable to be able to achieve differential field oxide growth using minimal patterning and growth steps.

The process used to achieve differential field oxide growth with minimal patterning and growth steps begins with a silicon substrate upon which is formed a pad oxide layer and a masking layer. Portions of the masking layer are removed to form "windows" in the masking layer. The window width in the core is smaller than the window width in the periphery. Use of the smaller window in the core takes advantage of the "field thinning effect."

According to the "field thinning effect," when the window width is smaller than a particular width specific to each oxidation process, oxidation will be significantly inhibited causing a smaller field oxide thickness to be grown than if the window width were larger. Thus, by patterning different sized windows in the core and periphery, different field oxide thicknesses can be grown in a single growth step.

A method in accordance with the invention further utilizes variable depth trenching. In accordance with one embodiment of the invention, a trench is formed in the substrate in alignment with each window prior to oxidation or oxide deposition. The trench formed in the wider windows (e.g., windows in the periphery region) is formed deeper than that formed in the narrower windows (e.g., windows in the core region). Oxidation or oxide deposition is then performed resulting in field oxide regions of variable width and of optimized planarity.

One embodiment of the invention forms trenches of variable depth by first growing field oxide regions of variable thickness, again in accordance with the "field thinning effect" by use of variable width windows. The resulting oxide regions of variable thickness are removed, resulting in deeper trenches where the removed oxide region was thicker and shallow trenches where the removed oxide regions were thinner. In this manner, trench depth is "self-tuned" to the window width.

The process in accordance with the invention is advantageous in that it improves packing density of devices per wafer because smaller field oxide thicknesses will be used when larger field oxide thicknesses are not required. Moreover, a method in accordance with the invention results in the formation of nearly planar field oxide regions.

BRIEF DESCRIPTION OF THE DRAWINGS

The invention will be described with respect to particular embodiments thereof, and reference will be made to the drawings in which.

DETAILED DESCRIPTION

Due to individual device considerations, e.g., voltages, doping, field thresholds, devices on many integrated circuits do not require that the isolation regions between devices on the integrated circuit be the same thickness. For instance, in memory devices, the isolation regions in the core 110 can be significantly smaller in thickness (e.g., 2500 Å) than the isolation regions in the periphery 100 (e.g., 4000 Å). By growing only the smallest isolation region necessary for effective isolation of devices, space on the wafer can be optimized and conserved.

Figure 4A:
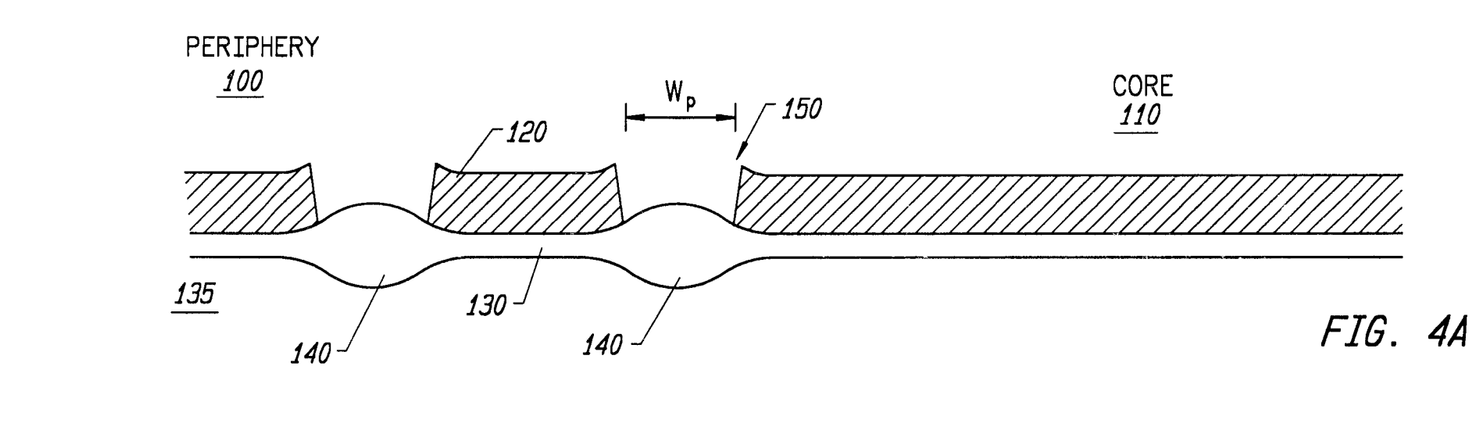
FIG. 4A shows a cross-sectional view of a wafer construct following the first step of one method for developing a wafer construct having differential field oxide thicknesses.
Figure 4B:
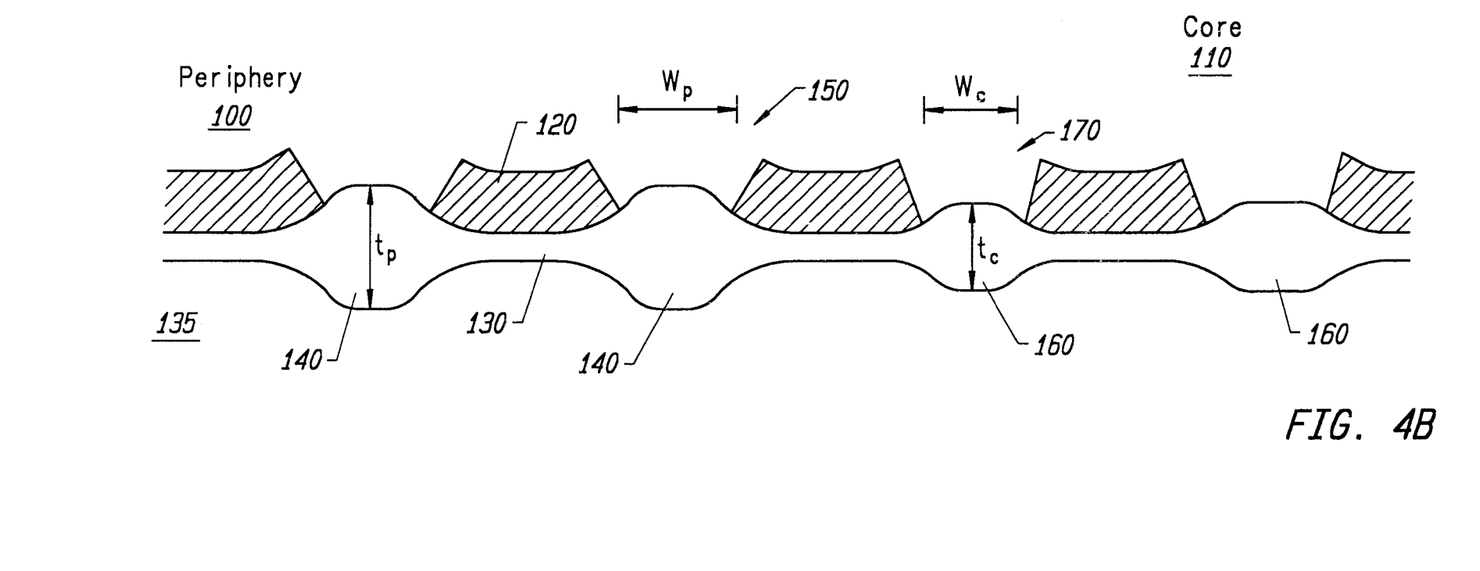
FIG. 4B is a cross-sectional view of a wafer construct following the second step in one method of forming a wafer construct having differential field oxide thicknesses.

One way to achieve dual field oxide thicknesses, one thickness in the core area 110 and one thickness in the periphery area 100, is to grow the field oxide in two steps: first, as shown in FIG. 4A, patterning the nitride in the periphery to form windows with width $W_p$ and growing a partial thickness in the periphery while the core remains completely covered with nitride; and second, as shown in FIG. 4B, patterning the core to form windows with width $W_c$ equal to width $W_p$ and growing the field oxide in the core to $t_c$ while the field oxide in the periphery continues growing to its final thickness of $t_p$. However, while this method accomplishes the goal of having dual field oxide thicknesses, it requires two patterning steps and two field oxide growths.

Thus, it is desirable to grow field oxide regions of different thicknesses on a single substrate using only a single patterning step and a single growth step. Therefore, in accordance with the invention, another way to accomplish differential field oxide growth is to take advantage of the "field thinning effect," which is characterized in FIG. 5. Under this effect, the thickness t of the field oxide grown depends upon the width of the "windows" 150 and 170 in nitride layer 120 (FIG. 6). As the window closes, the supply of oxygen to the substrate is reduced. While the magnitude and details of the field thinning effect will depend on the specifics of each oxidation cycle, e.g., time, temperature and ambient, and must be mapped for each oxidation cycle, the nitride spacing to field oxide thickness curve will generally appear as shown in FIG. 5 for most oxidation processes.

Figure 5:
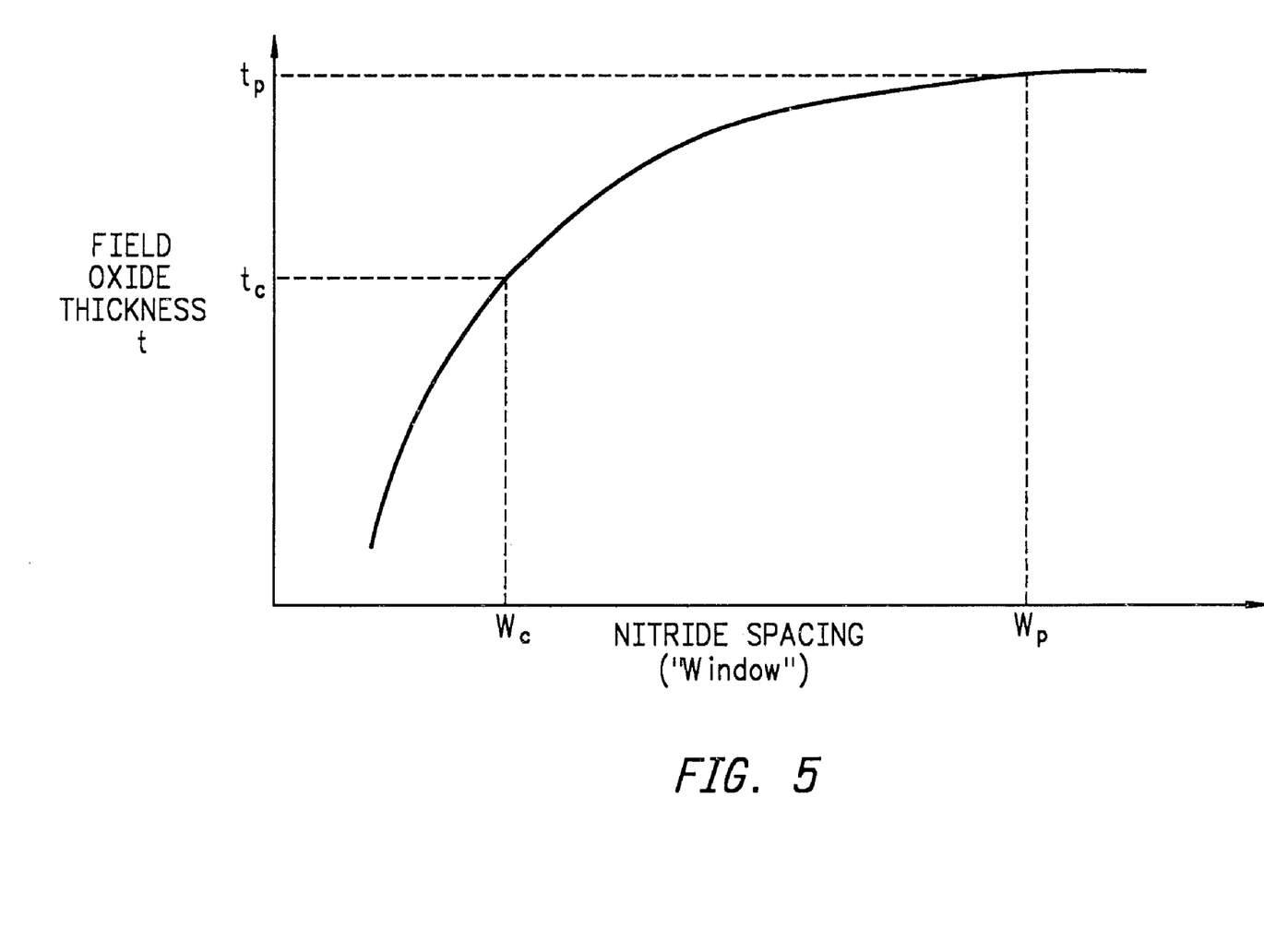
FIG. 5 is a generic characteristic curve of an oxidation process, showing nitride spacing to field oxide thickness.
Figure 6:
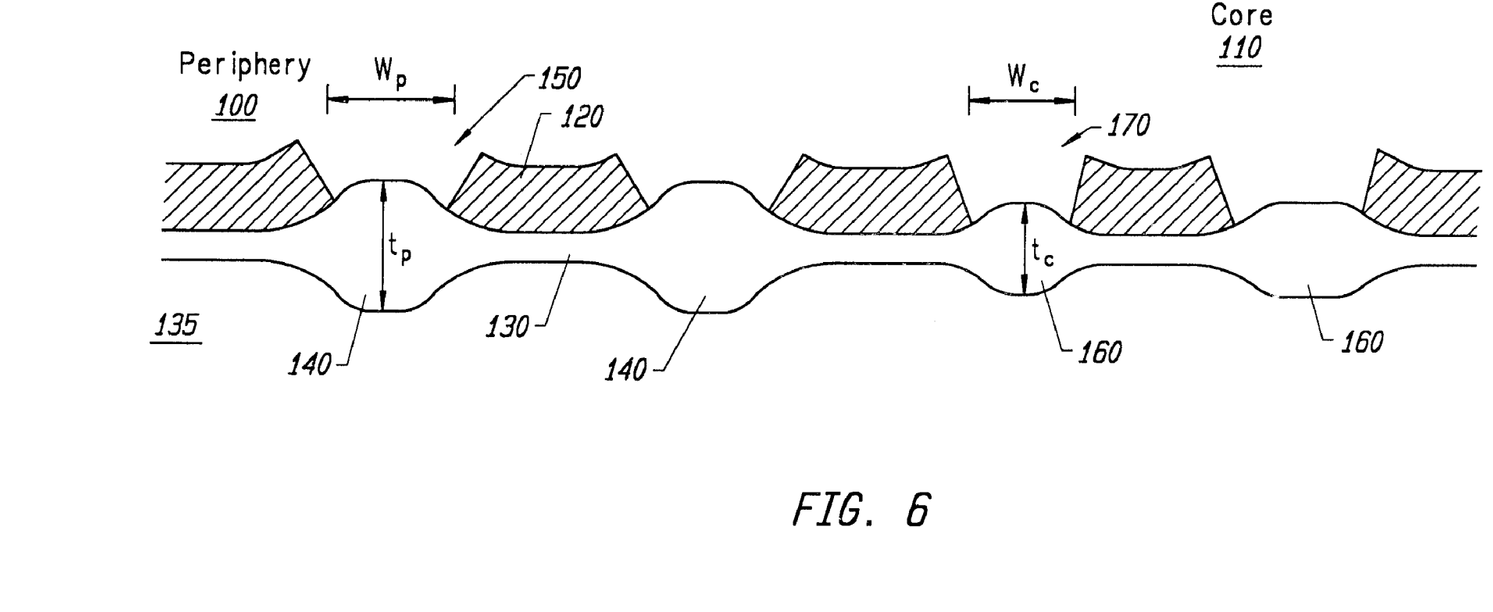
FIG. 6 is a cross-sectional view of a wafer construct resulting from one embodiment of the present invention.

Once the field oxide thicknesses desired for a particular device are determined, reference is made to the characteristic curve of the oxidation process generically shown in FIG. 5. By tracing a line horizontally from a thickness t to the curve and then from the curve vertically down, a determination of window width w can be made for thickness t. The nitride is then etched to pattern the surface with the various window widths determined from the characteristic curve, e.g., $W_p$ and $W_c$, as shown in FIG. 6. Note that the portion of the pad oxide 130 underlying the removed nitride portions may also be completely or partially removed in this etch step in one embodiment of the invention.

Oxidation of the exposed regions can then take place growing oxides to a thickness $t_p$ in the periphery and t in the core. If $W_c$ is found from the curve of FIG. 5 in the area where the curve "rolls off," and $W_p$ is taken from that part of the curve that is relatively flat, then, once oxidized, the resulting $t_c$ will be smaller than the resulting $t_p$, as shown in FIG. 6. Thus, only one patterning step and one field oxide growth is required.

Figure 7:
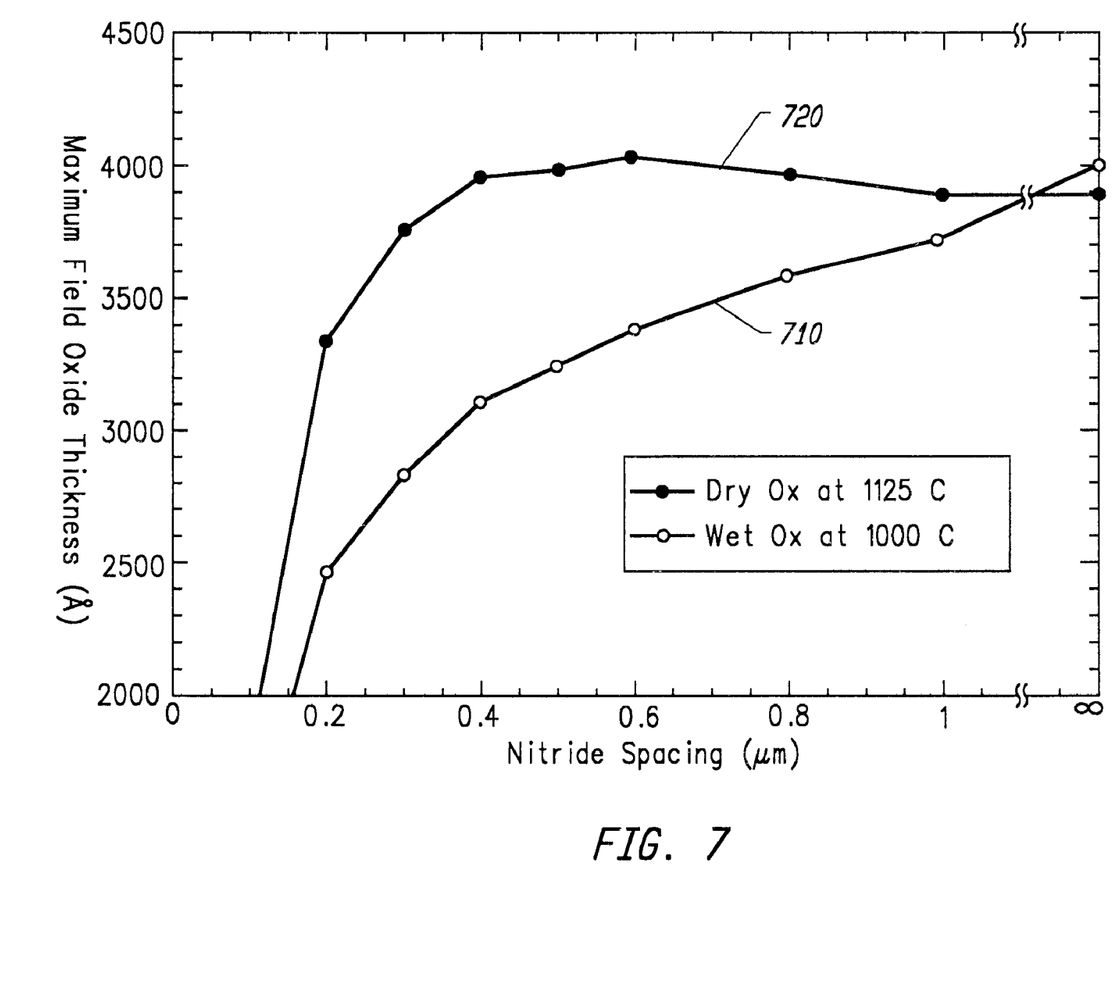
FIG. 7 is shows the characteristic curves of nitride spacing to field oxide thickness for a dry oxidation process and for a wet oxidation process.

FIG. 7 shows curves for a dry oxidation process at 1125° C. as well as a wet oxidation process at 1000° C. Note that the "rolloff" shown on these curves has conventionally been thought of as undesirable and most LOCOS processes avoid "windows" falling in the "rolloff" region. For the wet oxidation process at 1000° C. shown by curve 710, significant reductions in field oxide thickness occur when nitride spacing is below a width of one micron. However, for the dry oxidation process shown by curve 720, significant reductions occur in field oxide thickness at a window spacing of 0.4 microns and below. While either a wet oxidation process or a dry oxidation process can be used in alternative embodiments of the invention, because of the gradual sloping of the wet oxidation curve 710 from a width of one micron, it is likely that significant amounts of space on the substrate wafer will have to be sacrificed to achieve the same results as the dry oxidation process 720.

The dry oxidation process used in one embodiment of the invention is a multi-step oxidation process, in which a first oxidation step is performed at a temperature of approximately 1000° C. in an atmosphere comprising approximately 0.1–10% HCl and 90–99.9% $O_2$ for a period of approximately 30 to 120 minutes. This first oxidation step forms a thin oxide layer over nitride 120 to protect the nitride from reacting with HCl during the later oxidation steps. The reaction of nitride 120 with HCl is dependent on temperature and does not occur below approximately 1050° C. The purpose of adding HCl to the oxidizing atmosphere for the first oxidation step is to clean the surface to be oxidized by removing, for example, metallic contamination.

A second oxidation step is performed at a temperature of approximately 1125° C. in an atmosphere comprising approximately 0.1–10% HCl and 90–99.9% $O_2$ for a period of approximately 4 to 10 hours. As in the first oxidation step the concentrations of HCl and $O_2$ in the oxidizing environment may be optimized by those of ordinary skill in the art. HCl is added to the oxidizing environment in the second oxidation step to prevent stacking faults. It is believed that $O_2$ is injected into the crystalline lattice of silicon substrate 135 and that this interstitial $O_2$ causes mismatches in the lattice which lead to stacking faults. The HCl neutralizes the interstitial $O_2$, thereby preventing stacking faults.

Both oxidation steps include a stabilization period in an inert or oxidizing atmosphere. In the multi-step oxidation embodiment of the invention the atmosphere for the stabilization period of the first oxidation step comprises 10–40% $O_2$ and 60–90% Argon and the atmosphere for the stabilization period of the second oxidation step comprises approximately 100% Argon. Those of ordinary skill in the art will be able to optimize the atmosphere during the stabilization period. Further details regarding this oxidation process can be found in Liu, et al., U.S. Pat. No. 5,151,381, incorporated by reference herein.

Thus, a process has been described for forming field oxide regions of differing thicknesses in one patterning step and one growth step (the growth step in the embodiment described above includes two oxidation steps). Other embodiments are described below.

In another embodiment of the invention spacers are used to decrease the window size in the nitride. In such an embodiment the nitride layer would be patterned and etched in the core region. Then a spacer forming material, typically nitride, would be deposited over the patterned wafer, and then etched anisotropically to form spacers in the core. The nitride layer could then be patterned and etched in the periphery to form windows equal in width to those formed in the core prior to spacer formation. Field oxide growth could then occur in a single growth step. While this embodiment adds extra steps compared to other embodiments of the invention, such spacers could be useful in lithographically limited situations.

Figure 8A:
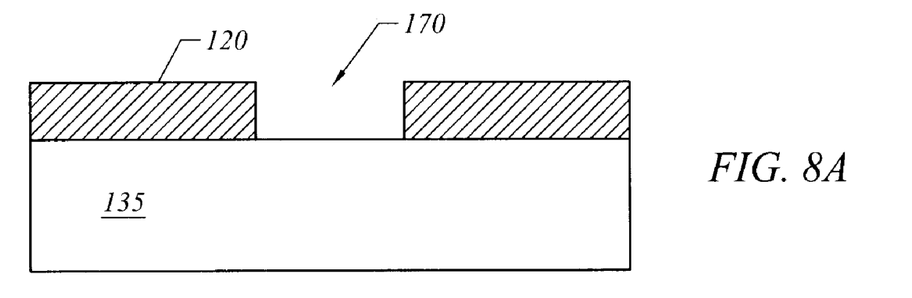
FIGS. 8A–8D show, in cross-sectional views, steps for forming a field oxide region that include substrate trenching.
Figure 8B:
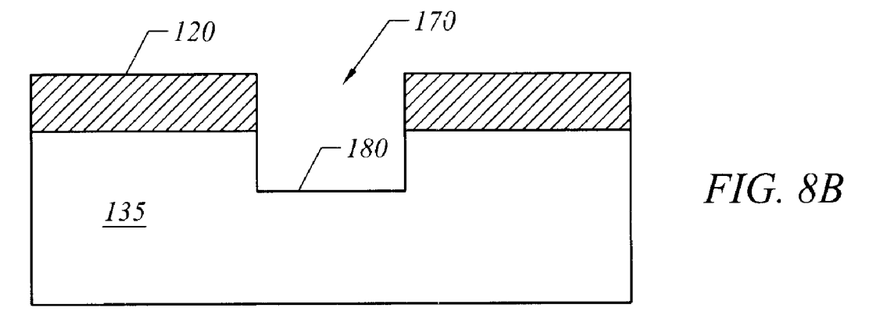
Figure 8C:
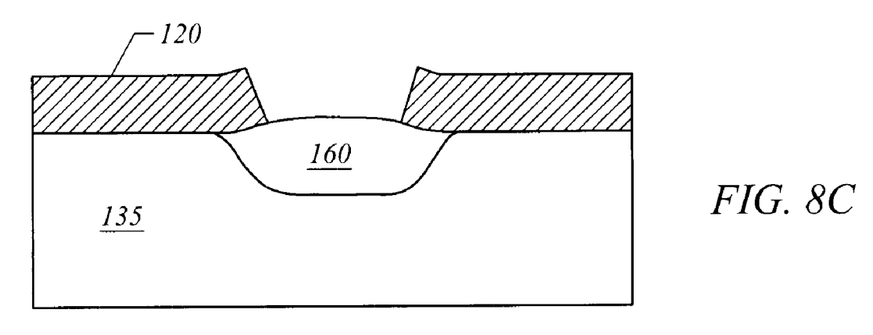
Figure 8D:
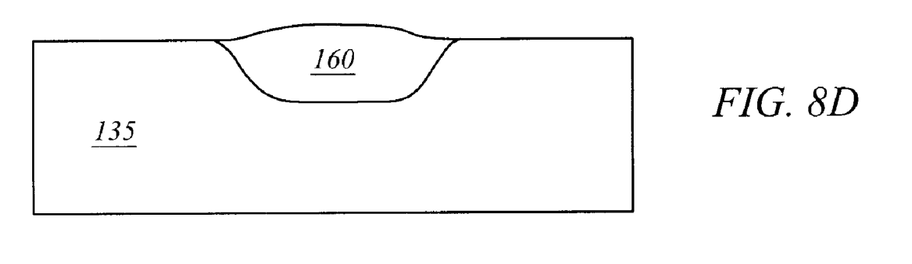

One embodiment of the invention utilizes substrate trenching to further improve the planarity of the field oxide. FIGS. 8A–8D illustrate substrate trenching. FIG. 8A shows the wafer structure having a nitride layer 120 formed on the substrate 135, where the nitride layer 120 has a window 170 formed therein. Although not shown in FIG. 8A, a thin pad oxide could also be used between the substrate and nitride as described previously. FIG. 8B shows the structure of FIG. 8A having a trench 180 etched, or otherwise formed, within substrate 135. FIG. 8C, shows the structure of FIG. 8B subsequent to oxidation and having field oxide region 160. FIG. 8D, shows the structure of FIG. 8C subsequent to nitride removal. As shown in FIG. 8D, when a trench is used, the planarity of the resulting structure is improved.

Figure 9:
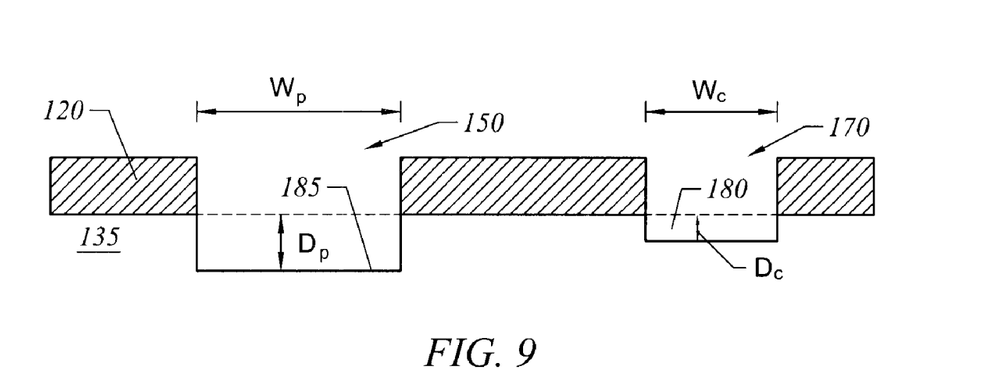
FIG. 9 illustrates a cross-sectional view of a substrate having variable width windows and variable depth trenches.
Figure 10:
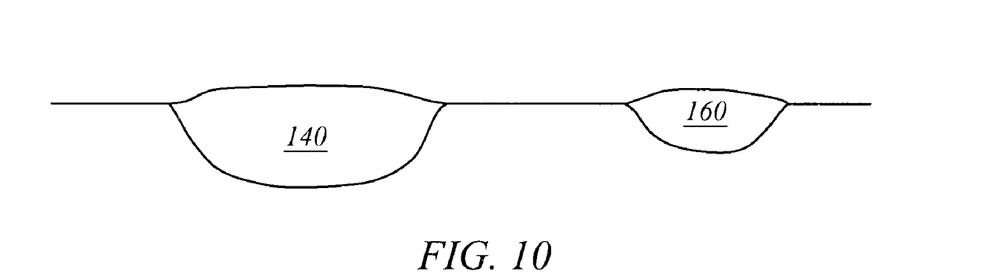
FIG. 10 illustrates a cross-sectional view of the structure of FIG. 9 subsequent to oxidation and nitride removal.
Figure 11A:
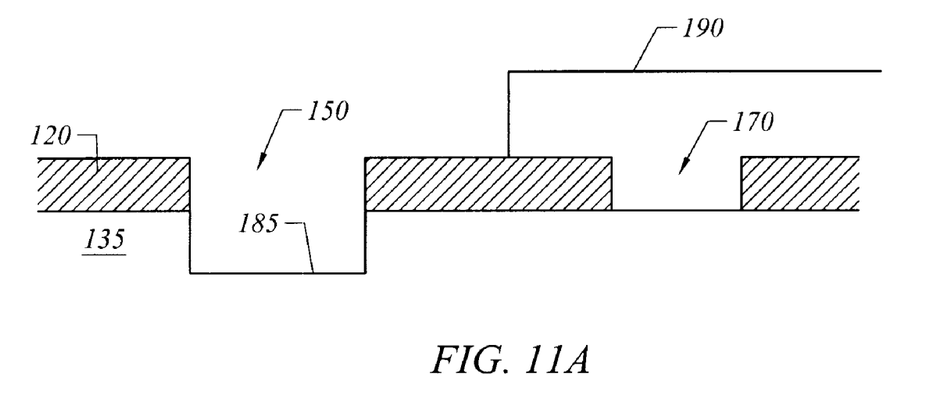
FIGS. 11A–B illustrate a first method in accordance with the invention for forming trenches of variable depth.
Figure 11B:
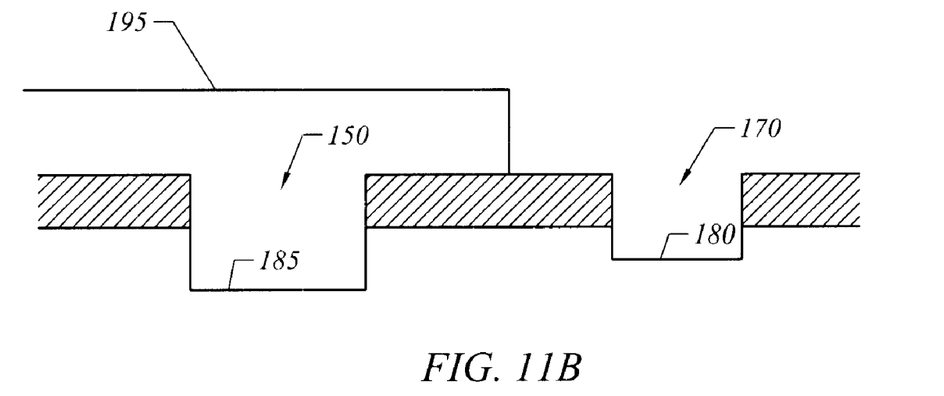

Referring again to FIG. 6, using a method with windows of differing widths will result in the field oxide regions of varying thicknesses, i.e., the thickness $t_p$ of $F_{ox}$ region 140 is greater than the thickness $t_c$ of the $F_{ox}$ region 160. By recognizing that trench depth is a determinant of resulting planarity, one embodiment of the invention utilizes a method combining variable window widths with variable trench depths. In this manner, optimized planarity can be achieved for a semiconductor device with variable field oxide thicknesses using minimal processing steps. More specifically, as shown in FIG. 9, for a wider window width $W_p$ a trench with depth $D_p$ is formed, while for a narrower window width $W_c$, a trench depth $D_c$ is formed, where $D_c < D_p$. The resulting oxidized structure is shown in FIG. 10, where $t_p > t_c$ and where both of the field oxide regions 140 and 160 are nearly planar with the substrate surface.

Referring now to FIGS. 11–14, there are several methods by which trenches of variable depths can be formed. First, referring to FIGS. 11A and 11B, after the nitride layer 120 having variable width windows is formed, a mask 190 is placed over the window 170 (and/or the entire core area). A trench 185 of a first depth is then formed in the window 150, by etching or other well known methods. Mask 190 is then removed and a second mask 195 is placed over the window 150 (and/or the entire periphery area) while a trench 180 of a second depth is formed in window 170. Although a trench 185, having a larger depth, is shown in FIGS. 11A and 11B as being formed first, there would be no reason that trench 180 could not be formed before trench 185. Further, although not shown in FIGS. 11A and 11B, a pad oxide can optionally be formed between the nitride and substrate. The same is true of FIGS. 12–15.

Figure 12A:
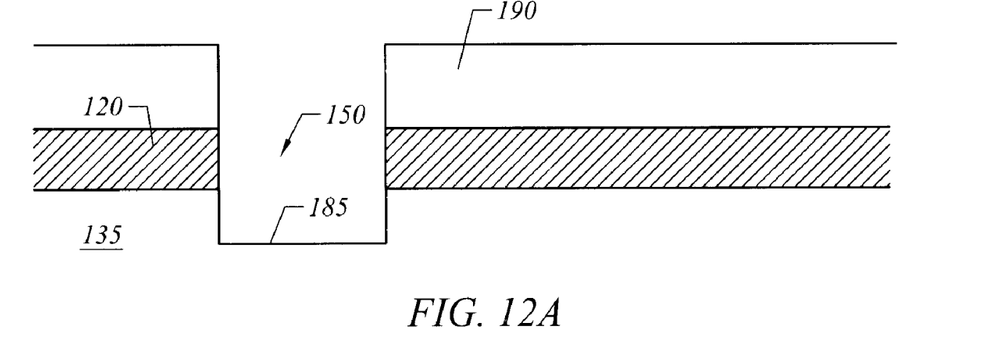
FIGS. 12A–12B illustrate a second method in accordance with the invention for forming trenches of variable depth.
Figure 12B:
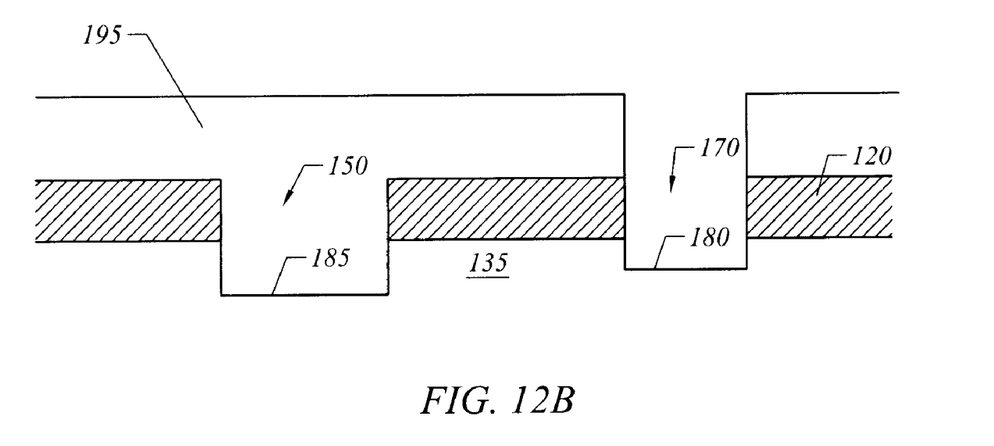

Alternatively, rather than forming windows in the nitride prior to trenching, a mask 190 can be formed over the un-etched nitride 120 and then used as a mask to form both window 150 in the nitride and the underlying trench 185, as shown in FIG. 12A. In FIG. 12B a new mask is applied and used to form the narrow window 170 and underlying trench 180. Whether the wide window or narrow window is formed first is optional.

Figure 13A:
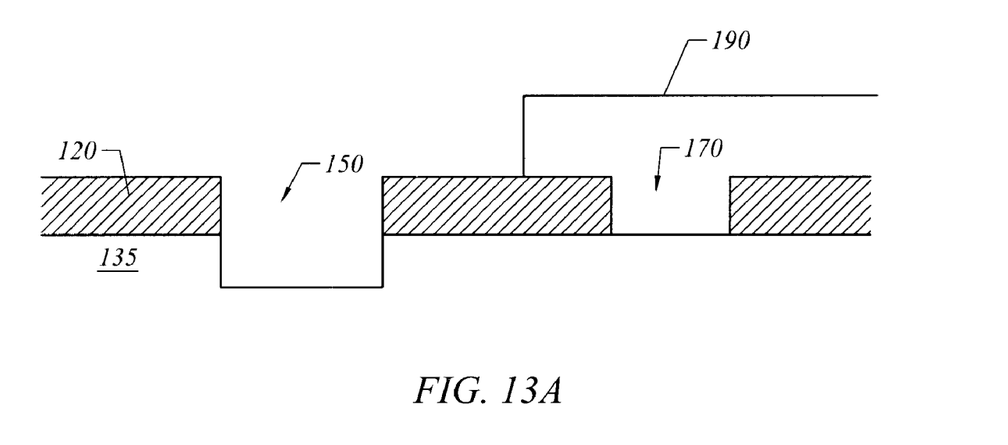
FIGS. 13A–B illustrate a third method in accordance with the invention for forming trenches of variable depth.
Figure 13B:
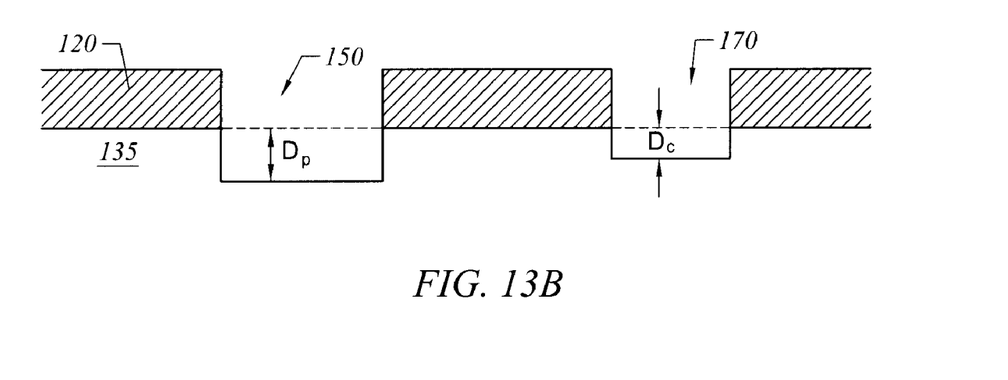

A third way to form variable depth trenches is shown in FIGS. 13A and 13B. First, as in FIG. 11A, a mask 190 is formed over window 170. A trench is then formed in window 150. However, the trench formed in window 150 is formed only partially etched, i.e., it is not etched to the depth that ultimately desired. In FIG. 13B, mask 190 is removed, and the trenches in both windows 150 and 170 are etched. In this manner, the trench 185 will reach its full depth of $D_p$ while the trench 180 will reach a depth of $D_c$.

Figure 14:
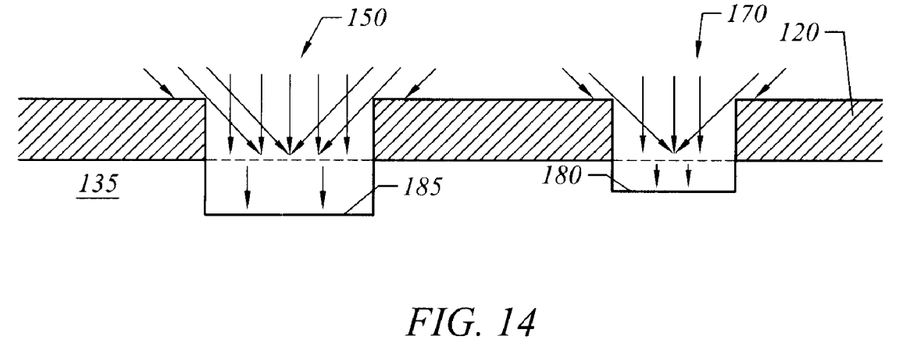
FIG. 14 illustrates a fourth method in accordance with the invention for forming trenches of variable depth.

A fourth way to form variable depth trenches is illustrated in FIG. 14. In FIG. 14, chemical reactants are utilized to form the trenches. These reactants react with and "eat away" at the substrate exposed by the respective windows. However, the trench 180 formed in the narrower window 170 will be shallower because the reactants are restricted by the window width in their ability to reach the substrate. A higher volume of reactants will have access to the substrate in window 150, thus forming a deeper trench 185.

After forming the variable depth trenches as described with respect to any of FIGS. 11–14, oxide regions are grown. Alternatively, oxide could be deposited in the trenches by known techniques. Either oxide growth or deposition will result in field oxide regions of variable thickness that are nearly planar with the substrate surface.

Figure 15A:
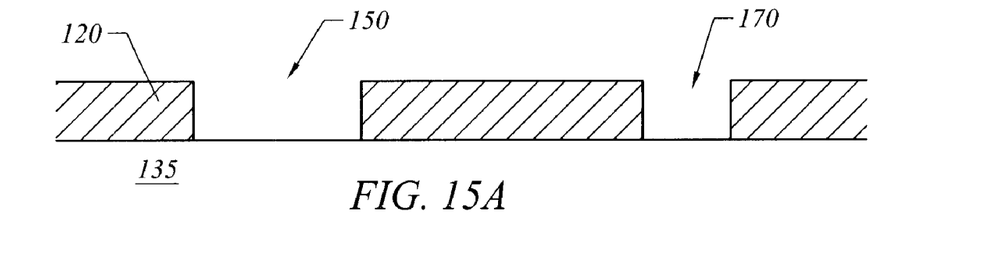
FIGS. 15A–E illustrate a fifth method in accordance with the invention for forming trenches of variable depth.
Figure 15B:
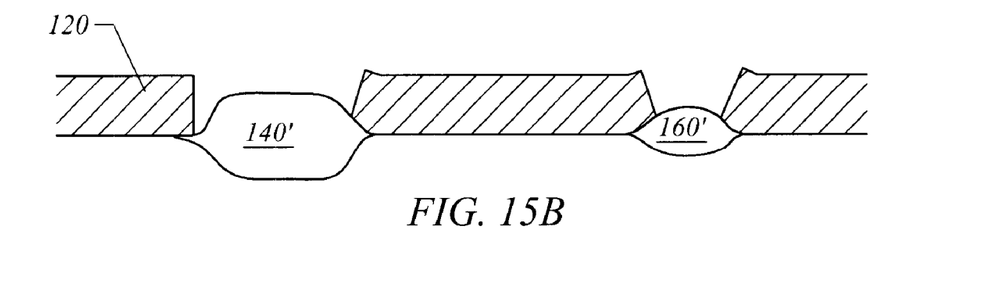
Figure 15C:
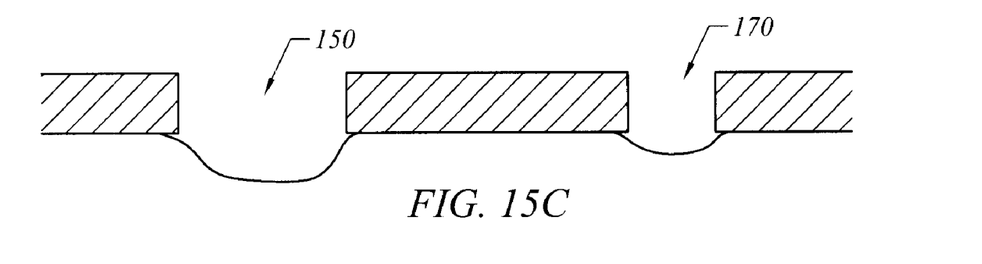
Figure 15D:
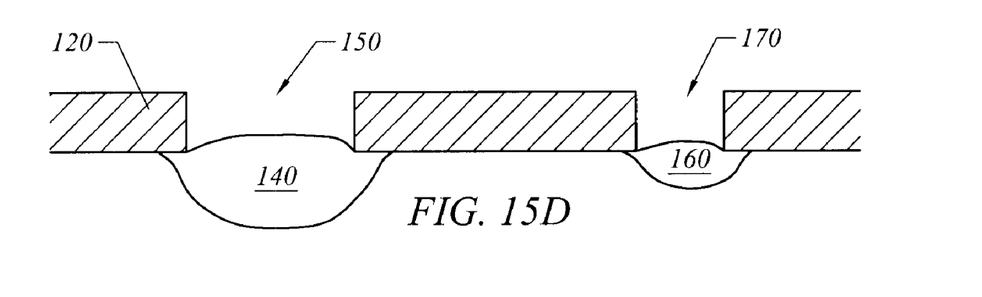
Figure 15E:
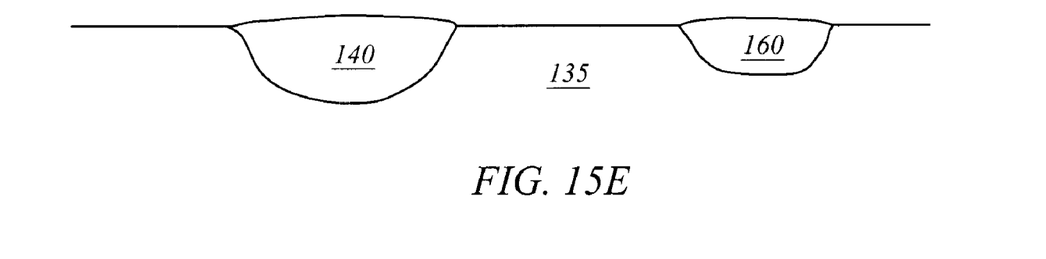

Finally, a fifth method of forming variable depth trenches is illustrated in FIGS. 15A–15E. In FIG. 15A, a nitride layer 120 having variable width windows 150 and 170 is formed on substrate 135. Field oxide regions are grown in the variable width windows as described previously in this description to form field oxide regions of variable thicknesses, 140' and 160', shown in FIG. 15B. Field oxide regions 140' and 160' are temporary and are removed, FIG. 15C. The removal of regions 140' and 160' results in differing trench depths essentially "self-tuned" to the window widths. More permanent field oxide regions 140 and 160 are then grown or deposited, FIG. 15D. As shown in FIG. 15E, the resulting structure, after removal of nitride layer 120 has planarity much improved over methods that do not utilize variable depth trenching.

It should be understood that the particular embodiments described above are only illustrative of the principles of the present invention, and various modifications could be made by those skilled in the art without departing from the scope and spirit of the invention. For instance, while the invention has been described in the context of a memory device, it is to be understood that the process according to the invention could also be used in developing PLD's or other integrated circuits and devices where differential field oxide thicknesses are desired. Thus, the scope of the present invention is limited only by the claims that follow.

What is claimed is:

1. A method of forming isolation regions on a substrate having a surface and having a masking layer formed over said substrate with a first window of a first width and a second window of a second width formed therein, wherein said first width is greater than said second width, comprising the steps of:

forming a first trench of a first depth in said substrate under said first window, said first trench having a width that corresponds approximately to said first width, and forming a second trench of a second depth in said substrate under said second window, said second trench having a width that corresponds approximately to said second width, wherein said first depth is greater than said second depth;

after the step of forming a first trench and a second trench, growing, in said first trench, a first isolation region of a first thickness and growing, in said second trench, a second isolation region of a second thickness;

wherein said step of growing said first isolation region and said second isolation region includes exposing said substrate to an oxidizing ambient; and wherein said first isolation region and said second isolation region are formed substantially planar with said substrate surface as a result of said step of growing.

2. The method of claim 1, wherein said step of forming a first trench and forming a second trench includes the steps of:

etching said first trench; and etching said second trench.

3. The method of claim 2, wherein said step of etching said second trench is performed after said step of etching said first trench.

4. The method of claim 2, wherein a part of said step of etching said first trench is performed simultaneously with said step of etching said second trench.

5. The method of claim 1, wherein said step of forming a first trench and forming a second trench includes the step of utilizing chemical reactants.

6. The method of claim 1, wherein said step of forming a first trench and forming a second trench includes the steps of:

forming a first temporary oxide region of a first thickness extending below said substrate surface and under said first window and forming a second temporary oxide region of a second thickness extending below said substrate surface and under said second window, wherein said first thickness is greater, than said second thickness; and removing said first temporary oxide region and said second temporary oxide region.

7. A method of forming isolation regions on a substrate having a surface and having a masking layer formed over said substrate with a first window having a first width and a second window having a second width, wherein said first width is greater than said second width, comprising the steps of:

growing a first temporary oxide region of a first thickness extending below said substrate surface and under said first window and growing a second temporary oxide region of a second thickness extending below said substrate surface and under said second window, wherein said first thickness is greater than said second thickness;

removing said first temporary oxide region and said second temporary oxide region thereby forming a first trench of a first depth, said first trench having a width that corresponds approximately to said first width, and a second trench of a second depth, said second trench having a width that corresponds approximately to said second width, wherein said first depth is greater than said second depth; and after the step of removing said first temporary oxide region and said second temporary oxide region, growing, in said first trench, a first permanent oxide region of a third thickness and growing, in said second trench, a second permanent oxide region of a fourth thickness, wherein said third thickness is greater than said fourth thickness.

8. The method of claim 7, wherein said step of growing a first permanent oxide region and a second permanent oxide region results in both said first permanent oxide region and said second permanent oxide region being substantially planar with said substrate surface.

9. The method of claim 7, wherein said steps of growing said first temporary oxide region and a second temporary oxide region and growing a first permanent oxide region and a second permanent oxide region include exposing said substrate to an oxidizing ambient.

* * * * *